(12) United States Patent
Huang et al.

(10) Patent No.: US 12,242,188 B2
(45) Date of Patent: Mar. 4, 2025

(54) PHOTOSENSITIVE RESIN COMPOSITION FOR IMPRINTING, CURED ARTICLE AND OPTICAL ELEMENT

(71) Applicant: eChem Solutions Corp., Taoyuan (TW)

(72) Inventors: Chin-Chen Huang, Taoyuan (TW); Yu-Lun Li, Taoyuan (TW); Chen-Wen Chiu, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 237 days.

(21) Appl. No.: 17/570,314

(22) Filed: Jan. 6, 2022

(65) Prior Publication Data

US 2022/0221789 A1    Jul. 14, 2022

(30) Foreign Application Priority Data

Jan. 8, 2021    (TW) .................... 110100745

(51) Int. Cl.
*G03F 7/00* (2006.01)
*G03F 7/029* (2006.01)
*G03F 7/035* (2006.01)

(52) U.S. Cl.
CPC .......... *G03F 7/0005* (2013.01); *G03F 7/0002* (2013.01); *G03F 7/029* (2013.01); *G03F 7/035* (2013.01)

(58) Field of Classification Search
CPC ...... G03F 7/0005; G03F 7/0002; G03F 7/029; G03F 7/035; G03F 7/0046; G03F 7/027; G03F 7/032; G03F 7/0388; G03F 7/0755
See application file for complete search history.

(56) References Cited

U.S. PATENT DOCUMENTS

| | | | | |
|---|---|---|---|---|
| 2006/0073342 A1* | 4/2006 | Ariga | ............... | B44C 1/175 428/480 |
| 2016/0052227 A1* | 2/2016 | Takihara | ............... | B32B 27/06 428/141 |
| 2021/0017308 A1* | 1/2021 | Song | ............... | C08F 20/34 |
| 2022/0169810 A1* | 6/2022 | Suzuki | ............... | C08J 7/042 |

FOREIGN PATENT DOCUMENTS

| | | | |
|---|---|---|---|
| CN | 101333347 | 4/2010 | |
| CN | 105176377 | 12/2015 | |
| JP | H10158374 | 6/1998 | |
| JP | 2003176343 | 6/2003 | |
| JP | 2019147917 | 9/2019 | |
| KR | 20170031854 | 3/2017 | |
| TW | 201042377 | 12/2010 | |
| TW | I554826 | 10/2016 | |
| TW | 201925323 | 7/2019 | |
| TW | 201945476 | 12/2019 | |
| TW | I688600 | 3/2020 | |
| TW | 202016159 | 5/2020 | |
| WO | WO 2020/203062 A1 * | 10/2020 | ............. B32B 27/20 |

OTHER PUBLICATIONS

"Office Action of Taiwan Counterpart Application", issued on Jul. 20, 2021, p. 1-p. 9.

* cited by examiner

*Primary Examiner* — Jessica M Roswell
(74) *Attorney, Agent, or Firm* — JCIPRNET

(57) ABSTRACT

A photosensitive resin composition for imprinting, a cured article and an optical element are provided. The photosensitive resin composition for imprinting includes a resin (A), an ethylenically unsaturated monomer (B), a photoinitiator (C), a solvent (D), and a hydrophobic oligomer (E). The resin (A) has a weight average molecular weight of 1,000 to 50,000 and has two or more ethylenic polymerizable groups.

16 Claims, No Drawings

PHOTOSENSITIVE RESIN COMPOSITION FOR IMPRINTING, CURED ARTICLE AND OPTICAL ELEMENT

CROSS-REFERENCE TO RELATED APPLICATION

This application claims the priority benefit of Taiwan application serial no. 110100745, filed on Jan. 8, 2021. The entirety of the above-mentioned patent application is hereby incorporated by reference herein and made a part of this specification.

BACKGROUND

Technical Field

The disclosure relates to a photosensitive resin composition, a cured article, and an optical element, and in particular to a photosensitive resin composition for imprinting, a cured article, and an optical element.

Description of Related Art

An imprint technology includes imprinting a mold insert (also referred to as a "mold," a "stamper," or a "template") with a pattern formed on the surface thereof on a resin, and accurately transferring the pattern onto the resin through a deformation of the resin.

At present, the industry has developed imprint technologies such as hot embossing lithography (HEL), step and flash imprinting lithography, and soft lithography. When hot embossing lithography is performed, a mold is pressed onto a resin that is heated to a temperature higher than a glass transition temperature, and subsequently the resin is cooled and then peeled from the mold. Accordingly, the structure of the mold is transferred onto the resin on a substrate. When step and flash imprinting lithography is performed, an optical curable composition is cured by ultraviolet light irradiation through a transparent mold or a transparent substrate at room temperature. When soft lithography is performed, after a flexible marking mold made of soft polymer material is coated with a self-assembly monomer (SAM), a slight pressure is applied onto a thin-film substrate, and the self-assembly monomer of a convex portion on a nanometer pattern mold is imprinted onto the thin-film substrate like ink.

However, in terms of the optical curable composition (a photosensitive resin composition) used in imprint technologies, relevant discussion of coefficient of thermal expansion, water absorption rate, and hardness has been scarce in the industry.

SUMMARY

In view of the above, the disclosure provides a photosensitive resin composition for imprinting with a high transmittance, a low coefficient of thermal expansion, a low water absorption rate, a high hardness, and a high Young's coefficient, a cured article formed by the photosensitive resin composition for imprinting, and an optical element containing the cured article.

The high transmittance means that the cured article has high transparency, so the cured article is adapted for the optical element. The low coefficient of thermal expansion means that the amount of thermal expansion deformation of the optical element in a high temperature environment is reduced. The high hardness means that damage or deformation of the optical element due to an external force is reduced. The high Young's coefficient means that the optical element is not easily deformed. Since the water absorption rate affects the transmittance, a refractive index, object physical properties etc. of the optical element, the low water absorption rate means that characteristics of the optical element are not easily affected by moisture.

The disclosure provides a photosensitive resin composition for imprinting, including a resin (A), an ethylenically unsaturated monomer (B), a photoinitiator (C), a solvent (D), and a hydrophobic oligomer (E). The resin (A) has a weight average molecular weight of 1,000 to 50,000, and has two or more ethylenic polymerizable groups.

In an embodiment of the disclosure, the hydrophobic oligomer (E) includes a fluorine-based acrylic oligomer (E-1).

In an embodiment of the disclosure, the hydrophobic oligomer (E) includes a silicone-based acrylic oligomer (E-2).

In an embodiment of the disclosure, the above resin (A) includes a resin (A-1) having a fluorene ring and two or more ethylenic polymerizable groups, polyurethane acrylate (A-2), or a combination thereof.

In an embodiment of the disclosure, the ethylenically unsaturated monomer (B) includes a compound represented by the following formula (I-1), a compound represented by the following formula (I-2), or a combination thereof.

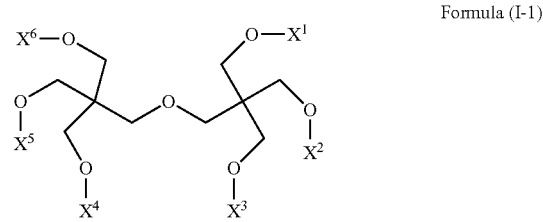

Formula (I-1)

In formula (I-1), $X^1$ to $X^6$ respectively represent a hydrogen atom, an acryloyl group, or a methacryloyl group. At least two of $X^1$ to $X^6$ are acryloyl groups or methacryloyl groups.

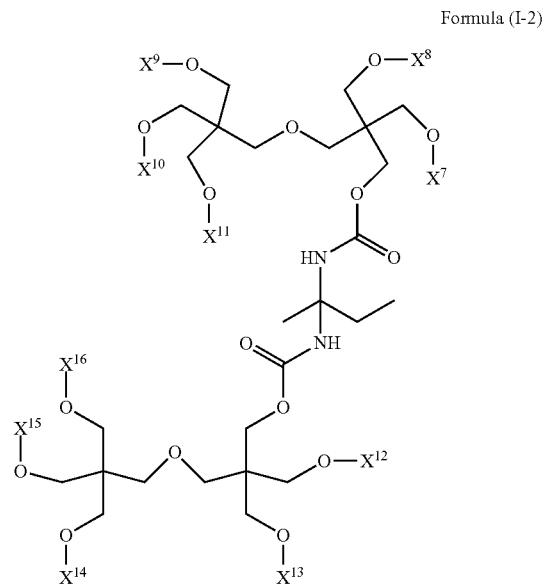

Formula (I-2)

In the formula (I-2), $X^7$ to $X^{16}$ respectively represent a hydrogen atom, an acryloyl group or a methacryloyl group. At least two of $X^7$ to $X^{16}$ are acryloyl groups or methacryloyl groups.

In an embodiment of the disclosure, the photoinitiator (C) includes an acyl phosphine oxide compound (C-1).

In an embodiment of the disclosure, based on 100% by weight of the photoinitiator (C), the acyl phosphine oxide compound (C-1) is 50 to 100% by weight.

In an embodiment of the disclosure, the solvent (D) includes propylene glycol monomethyl ether, propylene glycol monomethyl ether acetate, propylene glycol monoethyl ether, propylene glycol monopropyl ether, cyclopentanone, cyclohexanone, or a combination thereof.

In an embodiment of the disclosure, the photosensitive resin composition for imprinting includes a surfactant (F), and the surfactant (F) further includes a fluorine-based surfactant (F-1), a silicone-based surfactant (F-2), a non-ionic surfactant (F-3), or a combination thereof.

The disclosure provides a cured article formed by curing the photosensitive resin composition for imprinting.

In an embodiment of the disclosure, a thickness of the cured article is 1 to 5 μm.

In an embodiment of the disclosure, a transmittance of the cured article at a wavelength of 365 nm is greater than 94%, a transmittance of the cured article at a wavelength of 400 nm is greater than 98%, and a transmittance of the cured article at a wavelength of 500 to 1100 nm is greater than 99%.

In an embodiment of the disclosure, a Young's coefficient of the cured article is greater than 1 Gpa.

In an embodiment of the disclosure, a water absorption rate of the cured article is less than 0.5%.

In an embodiment of the disclosure, a Shore hardness D of the cured article is greater than 70.

In an embodiment of the disclosure, a coefficient of thermal expansion of the cured article is less than 100 ppm/° C.

In an embodiment of the disclosure, a refractive index of the cured article is greater than 1.5.

The disclosure provides an optical element, including the cured article.

Based on the above, the photosensitive resin composition for imprinting of the disclosure includes the resin (A), the ethylenically unsaturated monomer (B), the photoinitiator (C), the solvent (D), and the hydrophobic oligomer (E). The cured article formed by the photosensitive resin composition for imprinting has a high transmittance, a low coefficient of thermal expansion, a low water absorption rate, a high hardness, and a high Young's coefficient. Therefore, the cured article is adapted for the optical element.

DESCRIPTION OF THE EMBODIMENTS

<Photosensitive Resin Composition>

This embodiment provides a photosensitive resin composition for imprinting, including a resin (A), an ethylenically unsaturated monomer (B), a photoinitiator (C), a solvent (D), and a hydrophobic oligomer (E). In addition, if necessary, the photosensitive resin composition may further include an additive (G), a surfactant (F), or a combination thereof. Each ingredient of the photosensitive resin composition for imprinting (hereinafter also referred to as the "photosensitive resin composition") will be described in detail below.

In this specification, "(meth)acrylic acid" refers to "acrylic acid" and/or "methacrylic acid"; "(meth)acrylate" refers to "acrylate" and/or "methacrylate"; a "(meth)acryloyl group" refers to an "acryloyl group" and/or a "methacryloyl group"; and "(meth)acrylamide" refers to "acrylamide" and/or "methacrylamide."

In this specification, a "cured article" refers to a cured film or a bulk formed by curing the photosensitive resin composition.

Resin (A)

The resin (A) has a weight average molecular weight of 1,000 to 50,000 and has two or more ethylenic polymerizable groups.

The resin (A) includes a resin (A-1) having a fluorene ring and two or more ethylenic polymerizable groups (hereinafter referred to as the "resin (A-1)"), polyurethane acrylate (A-2), or a combination thereof.

Resin (A-1)

The resin (A-1) includes a structural unit having a fluorene ring and two or more ethylenic polymerizable groups. The resin (A-1) may have a weight average molecular weight of 1,000 to 50,000, preferably 2,000 to 20,000, more preferably 3,000 to 7,000, and still more preferably 4,500 to 5,000.

Specifically, the structural unit having a fluorene ring and two or more ethylenic polymerizable groups is preferably a structural unit represented by the following formula (1):

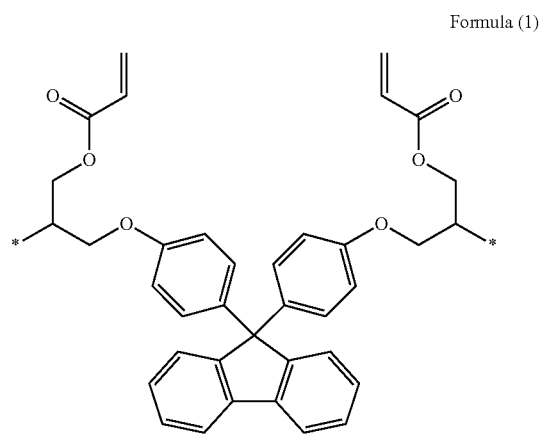

Formula (1)

In formula (1), * represents a bonding position.

In addition, the structural unit represented by the formula (1) is derived from a monomer represented by the following formula (1-1).

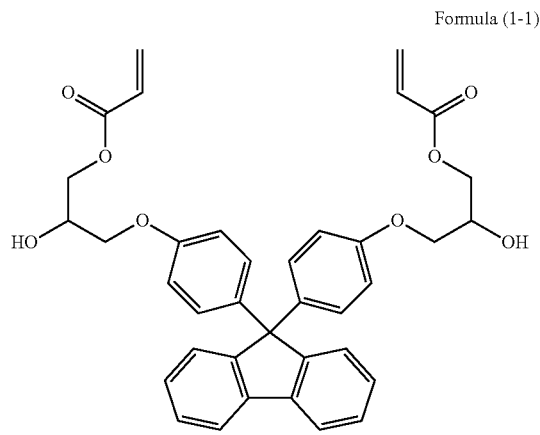

Formula (1-1)

The resin (A-1) is a cardo resin formed by polymerizing a monomer having a fluorene ring and two or more ethylenic polymerizable groups, tetracarboxylic dianhydride, and dicarboxylic acid. The monomer having a fluorene ring and two or more ethylenic polymerizable groups is preferably the monomer represented by the formula (1-1). Tetracarboxylic dianhydride and dicarboxylic acid are not particularly limited, and appropriate tetracarboxylic dianhydride and dicarboxylic acid may be selected according to needs.

In addition, the synthesis method of resin (A-1) is not particularly limited, either. A conventional organic synthesis method may be configured to polymerize a monomer with a fluorene ring and two or more ethylenic polymerizable groups, tetracarboxylic dianhydride, and dicarboxylic acid into a structural unit having a fluorene ring and two or more ethylenic polymerizable groups.

A specific example of the resin (A-1) includes a cardo resin (product name: KBR series, manufactured by KISCO Ltd.).

Based on 100 parts by weight of the resin (A), the resin (A-1) is 0 to 100 parts by weight.

When the resin (A-1) is included in the photosensitive resin composition, a cured article formed by the photosensitive resin composition may have a better adhesiveness.

Polyurethane Acrylate (A-2)

Polyurethane acrylate is not particularly limited and may be (1) a reaction product of hydroxyl-containing methyl acrylate and an isocyanate compound; (2) a reaction product of hydroxyl-containing methyl acrylate and polyurethane prepolymer containing isocyanate at the end; or a mixture of (1) and (2) as described above.

(1) In the reaction product of hydroxyl-containing methyl acrylate and an isocyanate compound, a specific example of hydroxyl-containing methyl acrylate is not particularly limited and may include methyl hydroxyalkyl acrylate. Specific examples of methyl hydroxyalkyl acrylate may include 2-hydroxyethyl (meth)acrylate, 2-hydroxypropyl (meth)acrylate, 4-hydroxybutyl (meth)acrylate, 6-hydroxyhexyl (meth)acrylate, or 8-hydroxyoctyl (meth)acrylate, or a combination thereof.

(1) In the reaction product of hydroxyl-containing methyl acrylate and an isocyanate compound, the isocyanate compound is a compound that includes at least two isocyanate groups. The isocyanate compound is not particularly limited and may include aliphatic polyisocyanate, cycloaliphatic polyisocyanate, aromatic polyisocyanate, or a combination thereof. Specific examples of the isocyanate compound may include 2,4-tolylene diisocyanate, 2,6-tolylene diisocyanate, 1,3-xylylene diisocyanate, 1,4-xylylene diisocyanate, diphenylmethane-4,4'-diisocyanate, and isophorone diisocyanate, or a combination thereof.

(2) The reactant of hydroxyl-containing methyl acrylate and polyurethane prepolymer containing isocyanate at the end includes, for example, a reactant of polyisocyanate and polyol ester.

Hydroxyl-containing methyl acrylate and polyisocyanate are the same as those in the reaction product of hydroxyl-containing methyl acrylate and an isocyanate compound in (1) as described above, respectively, and will not be repeated herein.

Polyol ester may include a polyol esterified product, a polyol ether esterified product, or an acid composition esterified product. The polyol esterified product is not particularly limited, wherein the specific examples of polyol may include ethylene glycol, propylene glycol, cyclohexanedimethanol, 3-methyl-1,5-pentanediol, or a combination thereof.

The polyol ether esterified product is not particularly limited, wherein specific examples of polyol ester may include polyalkylene glycol such as polyethylene glycol, polypropylene glycol, and polytetramethylene glycol, and a block polymer such as polyethylene polypropoxyblock polymer diol, or a random polymer, or a combination thereof.

The acid composition esterified product is not particularly limited, wherein specific examples of the acid composition may include dibasic acid or anhydride such as adipic acid, succinic acid, phthalic acid, tetrahydrophthalic acid, hexahydrophthalic acid, and terephthalic acid.

A specific example of polyurethane acrylate (A-2) includes polyurethane acrylate "Art Cure" RA series (weight average molecular weight: 40,000, glass transition point: 190° C., acid value: 90 mgKOH/g; manufactured by Negami Chemical Industrial Co., Ltd.).

Based on 100 parts by weight of the resin (A), polyurethane acrylate (A-2) is 0 to 100 parts by weight.

When the photosensitive resin composition includes polyurethane acrylate (A-2), the photosensitive resin composition may have a better adhesiveness.

In addition, the embodiment is not limited thereto. The resin (A) may also include other resins besides the resin (A-1) and polyurethane acrylate (A-2) without affecting the embodiment.

Ethylenically Unsaturated Monomer (B)

The ethylenically unsaturated monomer (B) in the photosensitive resin composition may facilitate a crosslinking reaction of the polymers in the photosensitive resin composition.

The ethylenically unsaturated monomer (B) includes a compound represented by the following formula (I-1), a compound represented by the following formula (I-2), or a combination thereof. In addition, the ethylenically unsaturated monomer (B) may further include an acryloyl monomer having a ring structure.

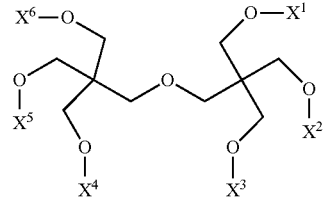

Formula (I-1)

In formula (I-1), $X^1$ to $X^6$ respectively represent a hydrogen atom, an acryloyl group or a methacryloyl group, and at least two of $X^1$ to $X^6$ are acryloyl groups or methacryloyl groups.

In formula (I-1), $X^1$ to $X^6$ preferably have five or more acryloyl groups or methacryloyl groups, and more preferably have six or more acryloyl groups or methacryloyl groups.

When there are two or more acryloyl groups or methacryloyl groups in formula (I-1), the hardness and the Young's coefficient of the cured article formed by the photosensitive resin composition may be further improved, and the coefficient of thermal expansion of the cured article formed by the photosensitive resin composition may be reduced. In addition, when there are five or more or even six or more acryloyl groups or methacryloyl groups contained in formula (I-1), the hardness and the Young's coefficient of the cured article formed by the photosensitive resin composition are better, and the coefficient of thermal expansion is lower. When the coefficient of thermal expansion of the cured article formed by the photosensitive resin composition is low, the cured film is less likely to be deformed due to a change in the ambient temperature when configured as an optical element, and characteristics of the optical element does not change due to the change in the ambient temperature.

Specific examples of the compound represented by formula (I-1) are preferably dipentaerythritol pentaacrylate, dipentaerythritol hexaacrylate (DPHA), dipentaerythritol pentamethacrylate, dipentaerythritol hexamethacrylate, or a combination thereof; and a specific example of the compound represented by formula (I-1) is more preferably dipentaerythritol hexaacrylate.

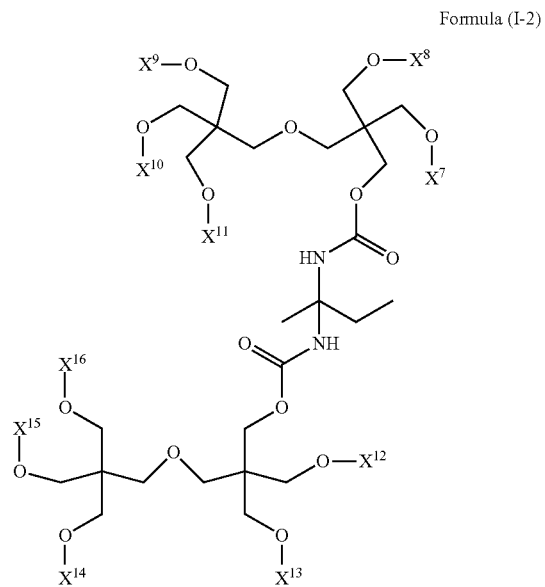

Formula (I-2)

In formula (I-2), $X^7$ to $X^{16}$ respectively represent a hydrogen atom, an acryloyl group or an methacryloyl group, in which at least two of $X^7$ to $X^{16}$ are acryloyl groups or methacryloyl groups.

In formula (I-2), $X^7$ to $X^{16}$ preferably have five or more acryloyl groups or methacryloyl groups, and more preferably have six or more acryloyl groups or methacryloyl groups, and even more preferably have ten acryloyl groups or methacryloyl groups.

When there are two or more acryloyl groups or methacryloyl groups in formula (I-2), the hardness and Young's coefficient of the cured article formed by the photosensitive resin composition may be further improved, and the coefficient of thermal expansion of the cured article formed by the photosensitive resin composition may be reduced. In addition, when there are five or more or even six or more acryloyl groups or methacryloyl groups contained in formula (I-2), the hardness and the Young's coefficient of the cured article formed by the photosensitive resin composition are better, and the coefficient of thermal expansion is lower.

A specific example of the compound represented by formula (I-2) is preferably multifunctional polyurethane acrylate (product name: DPHA-40H, manufactured by Nippon Kayaku Co., LTD).

In an embodiment, the ethylenically unsaturated monomer (B) includes the compound represented by formula (I-2) but does not include the compound represented by formula (I-1). In this case, the hardness and Young's coefficient of the cured article formed by the photosensitive resin composition are higher, and the coefficient of thermal expansion of the cured article formed by the photosensitive resin composition is lower.

Based on 100 parts by weight of the resin (A), the total amount of the compound represented by formula (I-1) and the compound represented by formula (I-2) is 100 to 700 parts by weight, and is preferably 200 to 600 parts by weight, and is more preferably 250 to 550 parts by weight.

The ring structure of the acryloyl monomer having a ring structure is not particularly limited, and is, for example, an aliphatic ring, an aromatic ring, or a hetero ring. The number of acryloyl groups contained in the acryloyl monomer having a ring structure is not particularly limited, and is preferably two or more. Specific examples of the acryloyl monomer having a ring structure include tricyclo[5.2.1.0$^{2,6}$]decane dimethanol diacrylate, 1,3-adamantanediol diacrylate, trimethylolpropane benzoate diacrylate, 1,3-cyclohexane dimethanol diacrylate, 1,4-cyclohexane dimethanol diacrylate, tris(2-propenoxyethyl) isocyanurate, or a combination thereof.

When the photosensitive resin composition includes an acryloyl monomer having a ring structure, on the premise of not affecting the ultraviolet transmittance, the hardness and Young's coefficient of the cured article formed by the photosensitive resin composition may be further improved, and the coefficient of thermal expansion of the cured article formed by the photosensitive resin composition may be further reduced.

Based on 100 parts by weight of resin (A), the acryloyl monomer having a ring structure is 10 to 400 parts by weight, and is preferably 20 parts to 350 parts by weight, and is more preferably 30 to 300 parts by weight.

In addition, the ethylenically unsaturated monomer (B) may further include other ethylenically unsaturated monomers. Specifically, said other ethylenically unsaturated monomers include a multifunctional monomer such as a compound represented by the following formula (II-1), a compound represented by the following formula (II-2), trimethylolpropane tri(meth)acrylate, glycerol di(meth)acrylate, glycerol triacrylate, 2,2-bis(4-(meth)acryloyloxy diethoxy phenyl)propane, 2,2-bis(4-(meth)acryloyloxy polyethoxy phenyl)propane, 2-hydroxy-3-(meth)acryloxy propyl(meth)acrylate, ethylene glycol diglycidyl ether di(meth)acrylate, diethylene glycol diglycidyl ether bis(methyl)acrylate, diglycidyl phthalate di(meth)acrylate, glycerin polyglycidyl ether poly(meth)acrylate, urethane(meth) acrylate, a reaction product of trimethylhexamethylene diisocyanate, hexamethylene diisocyanate, and 2-hydroxyethyl(meth)acrylate, and methylene bis(meth)acrylamide and a condensate polymer of polyol and N-hydroxymethyl (meth)acrylamide, or a combination thereof.

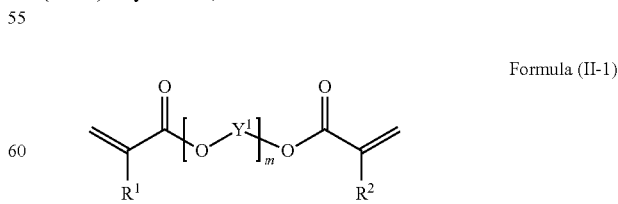

Formula (II-1)

In (II-1), $R^1$ and $R^2$ respectively represent a hydrogen atom or a methyl group, $Y^1$ represents a linear or branched alkyl group having a carbon number of 1 to 6, and m represents an integer of 1 to 8.

Specific examples of the compound represented by formula (II-1) include ethylene glycol di(meth)acrylate, diethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexanediol di(meth)acrylate, or a combination thereof.

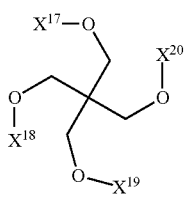

Formula (II-2)

In formula (II-2), $X^{17}$ to $X^{20}$ respectively represent a hydrogen atom, an acryloyl group or a methacryloyl group. At least two of $X^{17}$ to $X^{20}$ are acryloyl groups or methacryloyl groups.

Specific examples of the compound represented by formula (II-2) include pentaerythritol triacrylate, pentaerythritol tetraacrylate, pentaerythritol di(meth)acrylate, pentaerythritol tri(meth)acrylate, pentaerythritol tetra(meth)acrylate, or a combination thereof.

The ethylenically unsaturated monomer (B) may be configured alone or in combination.

Based on 100 parts by weight of the resin (A), the ethylenically unsaturated monomer (B) is 100 to 800 parts by weight, and is preferably 200 to 700 parts by weight, and is more preferably 250 to 600 parts by weight.

Photoinitiator (C)

The photoinitiator (C) in the photosensitive resin composition may generate a radical and cause polymerization in an exposure step to form a cured article from the photosensitive resin composition.

The photoinitiator (C) includes an acyl phosphine oxide compound (C-1). In addition, on the premise of not affecting the disclosure, the photoinitiator (C) may further include an oxime ester compound (C-2), a benzophenone compound (C-3), or a combination thereof. In addition, on the premise of not affecting the disclosure, the photoinitiator (C) may further include other photopolymerization initiators (C-4).

Acyl Phosphine Oxide Compound (C-1)

The acyl phosphine oxide compound (C-1) is an acyl phosphine oxide represented by formula (IV-1).

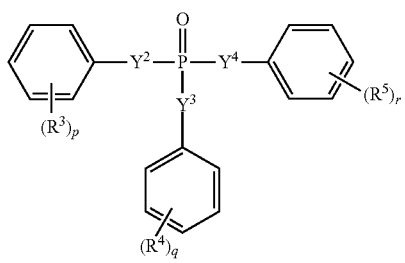

Formula (IV-1)

In formula (IV-1),
$Y^2$, $Y^3$, and $Y^4$ respectively represent a single bond or a carbonyl group, and at least one of $Y^2$, $Y^3$, and $Y^4$ is a carbonyl group;

$R^3$, $R^4$ and $R^5$ respectively represent an alkyl group;
p, q, and r respectively represent an integer of 0 to 5.

Specific examples of the acyl phosphine oxide compound (C-1) include bis(2,4,6-trimethylbenzoyl)phenyl phosphine oxide (product name: Irgacure 819, manufactured by BASF; a compound represented by the following formula (IV-1-1)), 2,4,6-trimethylbenzoyl diphenyl phosphine oxide (product name: TPO, manufactured by BASF; a compound represented by the following formula (IV-1-2)), or a combination thereof. Specific examples of the acyl phosphine oxide compound (C-1) preferably include bis(2,4,6-trimethylbenzoyl)phenyl phosphine oxide, 2,4,6-trimethylbenzoyl diphenyl phosphine oxide, or a combination thereof.

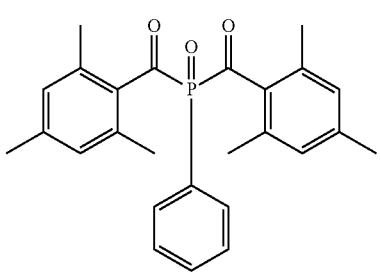

Formula (IV-1-1)

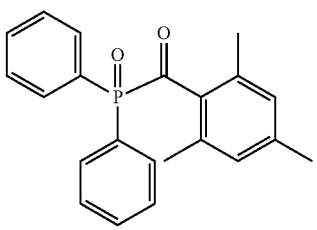

Formula (IV-1-2)

Based on 100% by weight of the photoinitiator (C), the acyl phosphine oxide compound (C-1) has 50 to 100% by weight.

Based on 100 parts by weight of the resin (A), the acyl phosphine oxide compound (C-1) is 0.1 to 50 parts by weight, and is preferably 1 to 40 parts by weight, and is more preferably 10 to 30 parts by weight.

When the photoinitiator (C) includes the acyl phosphine oxide compound (C-1), the curing speed of the photosensitive resin composition forming a cured article may be accelerated.

Oxime Ester Compound (C-2)

The oxime ester compound is a compound represented by formula (IV-2).

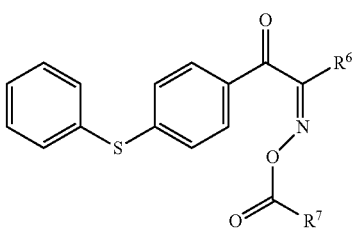

Formula (IV-2)

In formula (IV-2),
$R^6$ represents an alkyl group or a cycloalkyl group, preferably represents a hexyl group or a cyclopentyl group;
$R^7$ represents an alkyl group or a phenyl group, preferably represents a methyl group or a phenyl group.

Specific examples of the oxime ester compound (C-2) include a compound represented by formula (IV-2-1) (1,2-octanedione,1-[4-(phenylthio)phenyl-,2-(O-benzoyloxime)]) (product name: Irgacure OXE-01, manufactured by BASF), a compound represented by formula (IV-2-2) (product name: PBG-3057, manufactured by Changzhou Tronly New Electronic Materials Co., Ltd.), or a combination thereof.

Formula (IV-2-1)

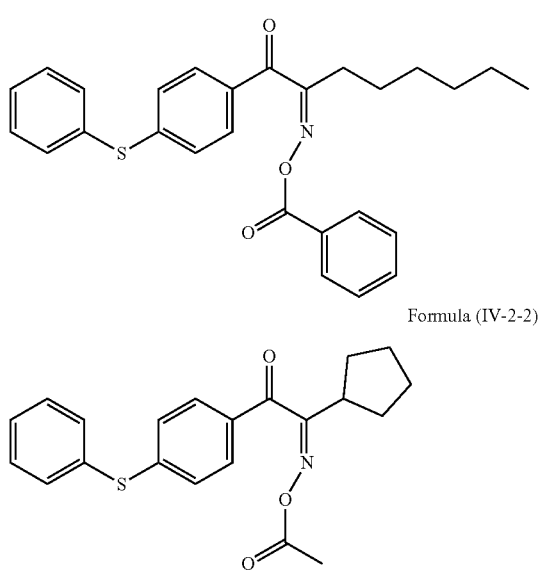

Formula (IV-2-2)

Benzophenone Compound (C-3)

The benzophenone compound (C-3) may include chemcure-BP and chemcure-64 (product name: chemcure-BP and chemcure-64; manufactured by Chembridge International Corp.) or other suitable benzophenone compounds. One type of the benzophenone compound may be configured alone, or various types of the benzophenone compound may be configured in combination.

Other Photopolymerization Initiators (C-4)

Said other photopolymerization initiators (C-4) are not particularly limited, and are, for example, a triazine compound, an acetophenone compound, a diimidazole compound, a thioxanthone compound, a quinone compound, or a combination thereof.

The triazine compound may include chemcure-PAG-1 (product name: chemcure-PAG-1; manufactured by Chembridge International Corp.), chemcure-PAG-2 (product name: chemcure-PAG-2; manufactured by Chembridge International Corp.), or other suitable triazine compounds. One type of the triazine compound may be configured alone, or various types of the triazine compound may be configured in combination.

The acetophenone compound may include Irgacure 907 and 369E (product name; BASF), chemcure-96 (product name; Chembridge International Corp.), or other suitable acetophenone compounds. One type of the acetophenone compound may be configured alone, or various types of the acetophenone compound may be configured in combination.

The diimidazole compound may include Chemcure-BCIM and Chemcure-TCDM (product name: Chemcure-BCIM and Chemcure-TCDM; manufactured by Chembridge International Corp.) or other suitable diimidazole compounds. One type of the diimidazole compound may be configured alone, or various types of the diimidazole compound may be configured in combination.

The thioxanthone compound may include Irgacure ITX (product name: Irgacure ITX; manufactured by BASF) or other suitable thioxanthone compounds. One type of the thioxanthone compound may be configured alone, or various types of the thioxanthone compound may be configured in combination.

A suitable quinone compound may be selected as the quinone compound. One type of the quinone compound may be configured alone, or various types of the quinone compound may be configured in combination.

Based on 100 parts by weight of the resin (A), the photoinitiator (C) is 0.1 to 100 parts by weight, and is preferably 1 to 80 parts by weight, and is more preferably 10 to 50 parts by weight.

Solvent (D)

The solvent (D) includes propylene glycol monomethyl ether, propylene glycol monomethyl ether acetate (PGMEA), propylene glycol monoethyl ether, propylene glycol monopropyl ether, cyclopentanone, cyclohexanone, or a combination thereof.

One type of the solvent (D) may be configured alone, or various types of the solvent (D) may be configured in combination.

Based on 100 parts by weight of the resin (A), the solvent (D) is 300 to 900 parts by weight, and is preferably 400 to 800 parts by weight, and is more preferably 450 to 750 parts by weight.

Hydrophobic Oligomer (E)

The hydrophobic oligomer (E) is not particularly limited, and an oligomer that may perform crosslinking reaction with ingredients such as the resin (A) may be selected according to needs.

The hydrophobic oligomer (E) may include a fluorine-based acrylic oligomer (E-1). Specific examples of the fluorine-based acrylic oligomer (E-1) include R-30, R-94, RS-75, RS-72-K, RS-76-NS, DS-21, RS-72-A, and RS-75-NS in the Megaface series manufactured by DIC, or a combination thereof. The fluorine-based acrylic oligomer (E-1) may be selected according to needs, that is, the fluorine-based acrylic oligomer (E-1) may perform a crosslinking reaction with ingredients such as the resin (A). Specific examples of the fluorine-based acrylic oligomer (E-1) preferably include RS-75, RS-72-A, RS-75-NS, or a combination thereof.

The hydrophobic oligomer (E) may include a silicone-based acrylic oligomer (E-2). Specific examples of the silicone-based acrylic oligomer (E-2) include BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380, BYK-390 manufactured by BYK-Chemie Gmbh, or a combination thereof. The silicone-based acrylic oligomer (E-2) may be selected according to needs, that is, the silicone-based acrylic oligomer (E-2) may perform a crosslinking reaction with ingredients such as the resin (A). A specific example of the silicone-based acrylic oligomer (E-2) preferably includes BYK-370.

When the photosensitive resin composition contains the hydrophobic oligomer (E) including the fluorine-based acrylic oligomer (E-1), the hydrophobic oligomer (E) may perform a crosslinking reaction with ingredients such as the resin (A). Accordingly, the water absorption rate of the cured article formed by the photosensitive resin composition may be further reduced.

In addition, on the premise of not affecting the disclosure, the hydrophobic oligomer (E) may further include other hydrophobic oligomers (E-3). Said other hydrophobic oligomers (E-3) are not particularly limited, and may be appropriately selected according to needs.

Based on 100 parts by weight of the resin (A), the hydrophobic oligomer (E) is 0.1 to 50 parts by weight, and is preferably 1 to 40 parts by weight, and is more preferably 10 to 30 parts by weight.

Surfactant (F)

On the premise of not affecting the disclosure, in addition to the above ingredients, the surfactant (F) may be added to the photosensitive resin composition according to needs. The surfactant (F) is not particularly limited, but basically the surfactant (F) does not perform a crosslinking reaction with ingredients such as the resin (A). For example, the surfactant (F) may include a fluorine-based surfactant (F-1), a silicone-based surfactant (F-2), a non-ionic surfactant (F-3), or a combination thereof.

Specific examples of the fluorine-based surfactant (F-1) include Megaface F444, F477, F554, F556, F563, and F575 (product name: Megaface F444, F477, F554, F556, F563, and F575; manufactured by DIC) or other suitable fluorine-based surfactants. The fluorine-based surfactant (F-1) may be selected according to needs, that is, the fluorine-based surfactant (F-1) does not perform a crosslinking reaction with ingredients such as the resin (A). One type of the fluorine-based surfactant (F-1) may be configured alone, or various types of the fluorine-based surfactant (F-1) may be configured in combination.

A specific example of the silicone-based surfactant (F-2) include a polysiloxane surfactant. Specifically, the silicone-based surfactant may include BYK-307, BYK-323, and BYK-348 (product name: BYK-307, BYK-323, and BYK-348; manufactured by BYK), and KP323, KP324, KP340, and KP341 (product name: KP323, KP324, KP340, and KP341; manufactured by Shin-Etsu Chemical Co., Ltd.), or other suitable silicone-based surfactants. The silicone-based surfactant (F-2) may be selected according to needs, that is, the silicone-based surfactant (F-2) does not perform a cross-linking reaction with ingredients such as the resin (A). One type of the silicone-based surfactant (F-2) may be configured alone, or various types of the silicone-based surfactant (F-2) may be configured in combination.

Specific examples of the non-ionic surfactant (F-3) include polyoxyethylene lauryl ether, polyoxyethylene stearyl ether, polyoxyethylene oil ether, polyoxyethylene octyl phenyl ether, polyoxyethylene nonyl phenyl ether, polyethylene glycol dilaurate, polyethylene glycol distearate, sorbitan fatty acid ester, or other suitable non-ionic surfactants. The non-ionic surfactant (F-3) may be selected according to needs, that is, the non-ionic surfactant (F-3) does not perform a crosslinking reaction with ingredients such as the resin (A). One type of the non-ionic surfactant (F-3) may be configured alone, or various types of the non-ionic surfactant (F-3) may be configured in combination.

Based on 100 parts by weight of the resin (A), the surfactant (F) is 0 to 20 parts by weight, and is preferably 0.1 to 10 parts by weight, and is more preferably 0.5 to 5 parts by weight.

Additive (G)

On the premise of not affecting the disclosure, in addition to the above ingredients, the additive (G) may be added to the photosensitive resin composition according to needs. The additive (G) is not particularly limited. Specifically, the additive (G) may include a photosensitizer, an antioxidant, an ultraviolet absorbent, a light stabilizer, an anti-aging agent, a plasticizer, an adhesion promoter, a thermal polymerization initiator, a photobase generator, a coloration agent, an inorganic particle, an elastomer particle, an alkali compound, a photo acid generator, a photo acid multiplier, a chain transfer agent, an antistatic agent, a flow regulator, an anti-foaming agent, a dispersant, or a combination thereof.

<Preparation of the Photosensitive Resin Composition>

The preparation of the photosensitive resin composition is not particularly limited, and an appropriate method for mixing various components may be selected according to needs. For example, the resin (A), the ethylenically unsaturated monomer (B), the photoinitiator (C), the solvent (D), and the hydrophobic oligomer (E) may be placed in a mixer and mixed so as to be evenly mixed into a solution status. The additive (G), the surfactant (F), or a combination of the above two may be further added when necessary. After the components are evenly mixed, the photosensitive resin composition in liquid form may be derived.

<Cured Article>

This embodiment provides a cured article, which is formed by curing the photosensitive resin composition for imprinting as described above. The cured article may be a cured film or a bulk.

This embodiment provides a cured film, which is formed by curing the photosensitive resin composition for imprinting as described above.

The cured film may be formed by coating the photosensitive resin composition on a substrate to form a coating, and prebaking, exposing, and postbaking the coating. Specifically, after the photosensitive resin composition is coated on the substrate to form a coating, the coating is pre-baked at a temperature of 80 to 100° C. for 3 to 5 minutes. Next, the pre-baked coating is exposed to 3000 J/m$^2$ with an i-line exposure machine (with a wavelength of 365 nm). Next, the coating is postbaked at 150 to 200° C. for 40 to 60 minutes to form the cured film on the substrate.

The substrate may be a glass substrate, a silicon wafer substrate, or a plastic substrate material (for example, a polysulfone (PES) board or a polycarbonate (PC) board). The type of the substrate is not particularly limited.

The coating method is not particularly limited, but a spray coating method, a roll coating method, a spin coating method, or a similar method may be configured, and generally, the spin coating method is widely configured. In addition, the coating is formed, and in some cases, subsequently, a residual solvent may be partially removed under a reduced pressure.

This embodiment provides a bulk, which is formed by curing the photosensitive resin composition for imprinting as described above.

The photosensitive resin composition is poured into a bulk mold and baked at a temperature of 100 to 140° C. for 24 to 36 hours. Next, the photosensitive resin composition is postbaked at 200 to 240° C. for 10 to 30 minutes to derive the bulk.

In an embodiment, the thickness of the cured article is 1 to 5 μm. In another embodiment, the thickness of the cured article is 3 to 5 μm.

In an embodiment, the transmittance of the cured article with the thickness of 1 to 5 μm at a wavelength of 365 nm is greater than 94%, the transmittance of the cured article with the thickness of 1 to 5 μm at a wavelength of 400 nm is greater than 98%, and the transmittance of the cured article with the thickness of 1 to 5 µm at a wavelength of 500 to 1100 nm is greater than 99%.

In an embodiment, the Young's coefficient of the cured article is greater than 1 Gpa, and is preferably greater than 4 Gpa, and is more preferably greater than 4.5 Gpa.

In an embodiment, the water absorption rate of the cured article is less than 0.5%.

In an embodiment, the Shore hardness D of the cured article is greater than 70.

In an embodiment, the coefficient of thermal expansion of the cured article is less than 100 ppm/° C., and is preferably less than 70 ppm/° C.

In an embodiment, the refractive index of the cured article with the thickness of 1 to 5 µm is greater than 1.5.

<Optical Element>

The disclosure provides an optical element, which includes the cured article as described above.

The optical element is, for example, an optical lens, an optical component, a transparent backlight plate, an encapsulating material in a micro light-emitting diode display (micro LED), a semiconductor integrated circuit, a flat screen, a microelectromechanical system (MEMS), a sensor element, an optical disk, a magnetic storage medium such as a high density memory disk, an optical part such as a diffraction grating or a relief hologram, a nano device, an optical element, and an optical film or a polarizing element configured to manufacture a flat panel display.

Hereinafter, the disclosure will be described in detail with reference to experimental examples. The following experimental examples are provided to describe the disclosure, and the scope of the disclosure includes the scope of the following claims and substitutions and modifications thereof, and is not limited to the scope of the experiments.

Experimental Examples and a Comparative Example of the Photosensitive Resin Composition and the Cured Article The following describes experimental examples 1 to 7 and comparative example 1 of the photosensitive resin composition and the cured film:

Experimental Example 1

I. Photosensitive Resin Composition 100 parts by weight of cardo resin (molecular weight: 5300; manufactured by KISCO Ltd.), 498 parts by weight of multifunctional polyurethane acrylate (product name: DPHA-40H, manufactured by Nippon Kayaku Co., LTD), 55 parts by weight of the acryloyl monomer having a ring structure, 5.48 parts by weight of bis(2,4,6-trimethylbenzoyl)phenyl phosphine oxide (product name: Irgacure 819, manufactured by BASF), 22.2 parts by weight of 2,4,6-trimethylbenzoyl diphenyl phosphine oxide (product name: TPO, manufactured by BASF), and 20.1 parts by weight of the fluorine-based acrylic oligomer 1 are added into 634 parts by weight of propylene glycol monomethyl ether acetate as the solvent. After the above is evenly mixed with a mixer, the preparation of the photosensitive resin composition of experimental example 1 is completed.

II. Cured Film

The photosensitive resin composition manufactured in the experimental examples or the comparative example is coated on an 8-inch glass substrate by the spin coating method (spin coater model: TEL-MK8, manufactured by Tokyo Electron Limited; rotating speed: about 1800 rpm). Next, the photosensitive resin composition is prebaked at a temperature of 90° C. for 3 minutes. Next, an i-line exposure machine (with a wavelength of 365 nm) (exposure machine model: FPA-5500 iZa, manufactured by Cannon) is configured to expose the photosensitive resin composition to 3000 J/m$^2$ so as to form a semifinished product. Finally, the photosensitive resin composition is postbaked at 150° C. for 60 minutes to derive the cured film.

III. Bulk

Each photosensitive resin composition prepared in the experimental examples or the comparative example is poured into a bulk mold and baked at a temperature of 120° C. for 24 hours. Next, the photosensitive resin composition is postbaked at 220° C. for 20 minutes to derive the bulk.

The prepared cured film or the bulk is evaluated by using the following evaluation methods. The results are represented by Table 1.

Experimental Examples 2 to 7 and Comparative Example 1

The photosensitive resin composition of experimental examples 2 to 7 and comparative example 1 are prepared with the same steps in experimental example 1, and the difference lies in the fact that the ingredient type and usage amount (as shown in Table 1) of the photosensitive resin composition are changed. The cured film or the bulk prepared from the photosensitive resin composition is evaluated by using the following evaluation methods, and the results are shown in Table 1.

TABLE 1

| Ingredient (parts by weight) | | Experimental examples | | | | | | | Comparative example |
|---|---|---|---|---|---|---|---|---|---|
| | | 1 | 2 | 3 | 4 | 5 | 6 | 7 | 1 |
| Resin (A) | Cardo resin | 100 | 100 | 100 | 0 | 0 | 0 | 0 | 0 |
| | Polyurethane acrylate | 0 | 0 | 0 | 100 | 100 | 100 | 100 | 100 |
| | Sum of resin (A) | 100 | 100 | 100 | 100 | 100 | 100 | 100 | 100 |
| Ethylenically unsaturated monomer (B) | Multifunctional polyurethane acrylate | 498 | 387 | 332 | 387 | 332 | 332 | 332 | 0 |
| | Dipentaerythritol hexaacrylate | 0 | 0 | 0 | 0 | 0 | 0 | 0 | 459 |
| | Acryloyl monomer having a ring structure | 55 | 166 | 221 | 166 | 221 | 221 | 221 | 50 |
| Sum of ethylenically unsaturated monomer (B) | | 553 | 553 | 553 | 553 | 553 | 553 | 553 | 509 |

TABLE 1-continued

| Ingredient (parts by weight) | | Experimental examples | | | | | | | Comparative example |
|---|---|---|---|---|---|---|---|---|---|
| | | 1 | 2 | 3 | 4 | 5 | 6 | 7 | 1 |
| Photoinitiator (C) | Bis(2,4,6-trimethylbenzoyl)phenyl phosphine oxide | 5.48 | 5.56 | 5.56 | 5.56 | 5.56 | 5.56 | 5.56 | 4.96 |
| | 2,4,6-trimethylbenzoyl diphenyl phosphine oxide | 22.2 | 22.1 | 22.1 | 22.1 | 22.1 | 22.1 | 22.1 | 20.1 |
| Sum of photoinitiator (C) | | 27.7 | 27.7 | 27.7 | 27.7 | 27.7 | 27.7 | 27.7 | 25.0 |
| Solvent (D) | Propylene glycol monomethyl ether acetate | 634 | 509 | 509 | 509 | 509 | 509 | 509 | 574 |
| Hydrophobic oligomer (E) | Fluorine-based acrylic oligomer 1 | 20.1 | 18.1 | 18.1 | 18.1 | 18.1 | 0 | 0 | 0 |
| | Fluorine-based acrylic oligomer 2 | 0 | 0 | 0 | 0 | 0 | 18.1 | 0 | 0 |
| | Fluorine-based acrylic oligomer 3 | 0 | 0 | 0 | 0 | 0 | 0 | 18.1 | 0 |
| Sum of hydrophobic oligomer (E) | | 20.1 | 18.1 | 18.1 | 18.1 | 18.1 | 18.1 | 18.1 | 0 |
| Evaluation result | Infrared transmittance (500 nm-1100 nm)(%) | 99.0 | 99.0 | 99.0 | 99.0 | 99.0 | 99.0 | 99.0 | 99.0 |
| | Visible light transmittance (400 nm)(%) | 98.0 | 98.0 | 98.0 | 98.0 | 98.0 | 98.0 | 98.0 | 97.0 |
| | Transmittance (365 nm)(%) | 94.7 | 94.8 | 94.6 | 94.7 | 94.5 | 94.3 | 94.6 | 93.6 |
| | Refractive index (940 nm) | 1.5230 | 1.5378 | 1.5248 | 1.5376 | 1.5248 | 1.5255 | 1.5231 | 1.5199 |
| | Coefficient of thermal expansion (ppm/° C.) | 68.1 | 52.5 | 32.5 | 57.8 | 35.3 | 41.1 | 40.8 | 110.5 |
| | Water absorption rate (%) | 0.491 | 0.451 | 0.434 | 0.448 | 0.423 | 0.481 | 0.490 | 0.973 |
| | Shore hardness (Shore D) | 74 | 76 | 80 | 81 | 85 | 83 | 84 | 67 |
| | Young's coefficient (GPa) | 4.5 | 4.5 | 4.8 | 4.6 | 5.2 | 5.0 | 4.9 | 3.7 |

The product names of the ingredients/compounds in Table 1 are shown in Table 2.

TABLE 2

| Ingredient/compound | Product name |
|---|---|
| Cardo resin | Product name: KBR series, manufactured by KISCO Ltd. |
| Polyurethane acrylate | Product name: Art Cure RA series (weight average molecular weight 40,000, glass transition point 190° C., acid value 90 mgKOH/g; manufactured by Negami Chemical Industrial Co., Ltd.) |
| Multifunctional polyurethane acrylate | Product name DPHA-40H, manufactured by Nippon Kayaku Co., LTD |
| Dipentaerythritol hexaacrylate | Product name: KAYARAD DPHA, manufactured by Nippon Kayaku Co., Ltd |
| Acryloyl monomer having a ring structure | Tricyclo[5.2.1.0$^{2,6}$]decane dimethanol diacrylate |
| Bis(2,4,6-trimethylbenzoyl)phenyl phosphine oxide | Product name: Irgacure 819, manufactured by BASF |
| 2,4,6-trimethylbenzoyl diphenyl phosphine oxide | Product name: TPO, manufactured by BASF |
| Fluorine-based acrylic oligomer 1 | Product name: RS-75 in the Megaface series, manufactured by DIC, containing an oligomer containing fluorine and hydrophobic groups, in which the oligomer has water repellency and oil repellency; the effective ingredient is 40 wt %, and the solvent is methyl ethyl ketone (MEK)/methyl isobutyl ketone (MIBK) with the weight ratio of 93/7 |
| Fluorine-based acrylic oligomer 2 | Product name: RS-75-NS in the Megaface series, manufactured by DIC |
| Fluorine-based acrylic oligomer 3 | Product name: RS-72-A in the Megaface series, manufactured by DIC |

<Evaluation Methods> a. Transmittance

An ultraviolet-visible spectrophotometer (model: U2900, manufactured by Hitachi High-technologies) is used to respectively measure the transmittance of a prepared cured film (with a thickness of 5 μm) at a wavelength of 190 to 1100 nm. Specifically, after the entire spectrum is scanned with the ultraviolet-visible spectrophotometer, the transmittance corresponding to a wavelength of 365 nm, 400 nm, and 500 nm is recorded.

b. Refractive Index

An ellipsometer (model: M2000, manufactured by J. A. Woollam Co. Inc.) is used to measure the refractive index of the prepared cured film (with a thickness of 5 μm) at a wavelength of 940 nm.

c. Coefficient of Thermal Expansion

A thermomechanical analyzer (model: TMA Q400, manufactured by TA instruments Inc.) is used to measure the linear coefficient of thermal expansion (CTE) in a range of 25° C. to 200° C. of a prepared bulk.

d. Water Absorption Rate

The prepared bulk is placed in an oven to dry. Next, the dried bulk is placed at 25° C. and 30% relative humidity (in a drying oven), and after 30-60 minutes the dried bulk is weighed, and a weight of the dried bulk $W_d$ is derived. The bulk is placed in water at 25° C. for 24 hours. Next, the bulk is taken out to derive a weight W of the bulk after the bulk absorbs water. Next, the water absorption rate is calculated according to the following mathematical formula (1).

Water absorption rate (%)=$(W-W_d)/W_d \times 100 \%$   Mathematical formula (1)

e. Shore Hardness

The Shore hardness of the bulk is measured by using a Shore D type hardness tester.

f. Young's Coefficient

A microhardness instrument (model: Hm2000, manufactured by Fischer Instruments) is used to measure the Young's coefficient of the prepared bulk.

<Evaluation Results>

Table 1 shows that when the photosensitive resin composition contains the resin (A), the ethylenically unsaturated monomer (B), the photoinitiator (C), the solvent (D), and the hydrophobic oligomer (E) (in experimental examples 1 to 7), the prepared cured film (the cured film or the bulk) not only meets the need of a high transmittance at each wavelength, but also has a low coefficient of thermal expansion, a low water absorption rate, a high hardness, and a high Young's coefficient. Therefore, the prepared cured article is adapted for the optical element.

In contrast, when the photosensitive resin composition does not contain the hydrophobic oligomer (in comparative example 1), the prepared cured article has a high water absorption rate, so the prepared cured article does not meet the need of a high transmittance, a low coefficient of thermal expansion, a low water absorption rate, a high hardness and a high Young's coefficient. Therefore, the prepared cured article is not adapted for the optical element.

In addition, experimental examples 1 to 7 and comparative example 1 show that the prepared cured article in experimental examples 1 to 7, in which polyfunctional polyurethane acrylate is used as the ethylenically unsaturated monomer (B), has a higher hardness, a higher Young's coefficient, and a lower water absorption rate than the prepared cured article in comparative example 1, in which dipentaerythritol hexaacrylate is used as the ethylenically unsaturated monomer (B).

In summary, the photosensitive resin composition of the disclosure includes the resin (A), the ethylenically unsaturated monomer (B), the photoinitiator (C), the solvent (D), and the hydrophobic oligomer (E). Therefore, the cured article formed by the photosensitive resin composition has a high transmittance, a low coefficient of thermal expansion, a low water absorption rate, a high hardness, and a high Young's coefficient, so the cured article is adapted for the optical element.

Although the disclosure has been disclosed by the embodiments as described above, the embodiments are not used to limit the disclosure. Anyone with ordinary knowledge in the technical field may make some changes and modifications without departing from the spirit and scope of the disclosure. Therefore, the protection scope of the disclosure shall be subject to the scope of the attached claims.

What is claimed is:

1. A photosensitive resin composition for imprinting, comprising:

a resin (A), wherein the resin (A) has a weight average molecular weight of 1,000 to 50,000 and has two or more ethylenic polymerizable groups;

an ethylenically unsaturated monomer (B);

a photoinitiator (C), wherein the photoinitiator (C) is consisting essentially of an acylphosphine oxide compound (C-1);

a solvent (D); and a hydrophobic oligomer (E), wherein based on 100 parts by weight of the resin (A), the ethylenically unsaturated monomer (B) is 100 to 800 parts by weight, the acylphosphine oxide compound (C-1) is 10 to 30 parts by weight, the solvent (D) is 300 to 900 parts by weigh, and the hydrophobic oligomer (E) is 0.1 to 50 parts by weight.

2. The photosensitive resin composition for imprinting according to claim 1, wherein the hydrophobic oligomer (E) comprises a fluorine-based acrylic oligomer (E-1).

3. The photosensitive resin composition for imprinting according to claim 1, wherein the hydrophobic oligomer (E) comprises a silicone-based acrylic oligomer (E-2).

4. The photosensitive resin composition for imprinting according to claim 1, wherein the resin (A) comprises a resin (A-1) having a fluorene ring and two or more ethylenic polymerizable groups, polyurethane acrylate (A-2), or a combination thereof.

5. The photosensitive resin composition for imprinting according to claim 1, wherein the ethylenically unsaturated monomer (B) comprises a compound represented by the following formula (I-1), a compound represented by the following formula (I-2), or a combination thereof,

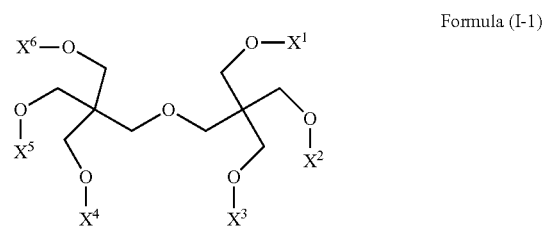

Formula (I-1)

in formula (I-1), $X^1$ to $X^6$ respectively represent a hydrogen atom, an acryloyl group, or a methacryloyl group, wherein at least two of $X^1$ to $X^6$ are acryloyl groups or methacryloyl groups,

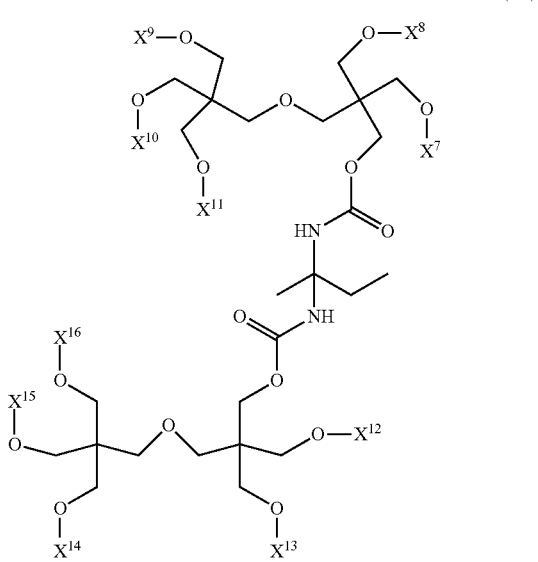

Formula (I-2)

in formula (I-2), $X^7$ to $X^{16}$ respectively represent a hydrogen atom, an acryloyl group, or a methacryloyl group, wherein at least two of $X^7$ to $X^{16}$ are acryloyl groups or methacryloyl groups.

6. The photosensitive resin composition for imprinting according to claim 1, wherein the solvent (D) comprises propylene glycol monomethyl ether, propylene glycol monomethyl ether acetate, propylene glycol monoethyl ether, propylene glycol monopropyl ether, cyclopentanone, cyclohexanone, or a combination thereof.

7. The photosensitive resin composition for imprinting according to claim 1, further comprising a surfactant (F), wherein the surfactant (F) comprises a fluorine-based surfactant (F-1), a silicone-based surfactant (F-2), a non-ionic surfactant (F-3), or a combination thereof.

8. A cured article, formed by curing the photosensitive resin composition for imprinting according to claim 1.

9. The cured article according to claim 8 having a thickness of 1 to 5 μm.

10. The cured article according to claim 9 having a transmittance greater than 94% at a wavelength of 365 nm, a transmittance greater than 98% at a wavelength of 400 nm, and a transmittance greater than 99% at a wavelength of 500 to 1100 nm.

11. The cured article according to claim 8 having a Young's coefficient greater than 1 Gpa.

12. The cured article according to claim 8 having a water absorption rate less than 0.5%.

13. The cured article according to claim 8 having a Shore hardness D greater than 70.

14. The cured article according to claim 8 having a coefficient of thermal expansion less than 100 ppm/° C.

15. The cured article according to claim 8 having a refractive index greater than 1.5.

16. An optical element, comprising the cured article according to claim 8.

* * * * *